United States Patent [19]

Nitschke et al.

[11] Patent Number: 4,997,735
[45] Date of Patent: Mar. 5, 1991

[54] VACUUM CONTACTING PROCESS FOR PHOTOGRAPHIC ELEMENTS

[75] Inventors: Timothy E. Nitschke, Pittsford; Mark A. Lewis, Fairport; Ronald J. Schmidt, Rochester, all of N.Y.

[73] Assignee: Eastman Kodak Company, Rochester, N.Y.

[21] Appl. No.: 344,948

[22] Filed: Apr. 28, 1989

[51] Int. Cl.$^5$ .......................... G03F 9/00; G03C 1/04
[52] U.S. Cl. ...................... 430/22; 430/327; 430/396; 430/496; 427/294; 427/296; 428/147
[58] Field of Search ................ 430/22, 327, 396, 496; 428/147; 427/294, 296

[56] References Cited

U.S. PATENT DOCUMENTS

| | | | |
|---|---|---|---|
| 3,227,576 | 1/1966 | Van Stappen | 117/76 |
| 3,589,905 | 6/1971 | Reedy et al. | 96/87 |
| 4,127,685 | 11/1978 | Busky et al. | 427/294 |
| 4,201,581 | 5/1980 | Thomas et al. | 430/396 |
| 4,203,769 | 5/1980 | Guestaux | 430/631 |
| 4,216,289 | 8/1980 | Oda et al. | 430/496 |
| 4,711,838 | 12/1987 | Grzeskowiak et al. | 430/510 |
| 4,745,019 | 5/1988 | Posey et al. | 430/950 |
| 4,855,219 | 8/1989 | Bagchi et al. | 430/523 |

*Primary Examiner*—Hoa Van Le
*Attorney, Agent, or Firm*—Paul L. Marshall

[57] ABSTRACT

A process of contacting two photographic elements by juxtaposing the elements and drawing a vacuum between them is described wherein at least one of the elements has been exposed and processed and comprises a support having thereon, as the outermost layer facing the other element, a matte layer comprising matte particles and a polymeric binder. This process is improved by utilizing as the matte layer a layer comprising less than about 1.08 g/m$^2$ of binder and having matte particles that are present in an amount sufficient and have a mean diameter great enough so that the outermost layer has a roughness measurement, $R_a$ as defined by ANSI Standard B46.1 1985, of greater than about 1.00 microinches.

8 Claims, No Drawings

VACUUM CONTACTING PROCESS FOR PHOTOGRAPHIC ELEMENTS

FIELD OF THE INVENTION

This invention relates to photography and, in particular, to a process for vacuum contacting two photographic elements. This process is especially useful with high-contrast graphic arts photographic elements.

BACKGROUND OF THE INVENTION

In many processes for copying or duplicating an image or a reversal of an image from one photographic element onto another photographic element, it is often desirable to bring the elements into close contact with one another and expose through the "original" element already having an image thereon to expose the other element. Such contact printing or exposure is often used for high-contrast graphic arts products. This technique may be used for example, to expose through a photographic element having a high-contrast half-tone original onto a lithographic printing plate or to duplicate or make a reversal image by exposing through such a photographic element onto another.

A common technique for bringing the elements into close contact with one another is to juxtapose the elements and draw a vacuum from between them. This is often accomplished with a device known as a vacuum frame. Vacuum frames are widely used in the photographic art and especially in the graphic arts for this purpose.

When smooth surfaced elements are brought into such vacuum contact, however, the time required to evacuate from between the elements and obtain a substantially uniform and complete contact between them becomes exceedingly high. Moreover, even after long periods of time, uniform and complete contact might not be achieved. For this reason, matte particles are often incorporated in the outermost layer of at least one of the elements to provide for efficient evacuation (also known as vacuum draw-down) from between the elements. Matte particles are also useful in preventing the formation of Newton rings that can occur during contact exposure.

The binder of previous matte layers used in element subjected to vacuum draw-down, which is usually gelatin, is generally coated at a level so that a large part of each of the matte particles in the layer resides below the surface of the layer. This inhibits the efficiency of the matte particle at providing the surface of the element with the roughness necessary to achieve the desired vacuum draw-down efficiency. Often, large quantities or particle diameters or both must be used in order to achieve the desired draw-down.

SUMMARY OF THE INVENTION

It has now been found that by using a lower level of a polymer binder that is still sufficient to bind the matte particles to the surface of the element, the efficiency of the vacuum draw-down process can be significantly improved. This efficiency can be realized through decreased vacuum draw-down times required to achieve close contact, through material savings by using less or smaller matte particles, or both.

Accordingly, the present invention provides a process of contacting two photographic elements by juxtaposing the elements and drawing a vacuum between wherein at least one of the elements has been exposed and processed and comprises a support having thereon, as the outermost layer facing the other element, a matte layer comprising matte particles and a polymeric binder. This process is improved by utilizing an element where the matte layer comprises less than about 1.08 g/m$^2$ binder and matte particles that are present in an amount sufficient and have a mean diameter great enough so that the outermost layer has a roughness measurement, $R_a$ as defined by ANSI Standard B46.1 1985, of greater than about 1.00 microinches. The value of $R_a$ according to this standard is a center line or arithmetic average of the height of surface features measured by a tracing stylus. $R_a$ is determined by the following formula:

$$R = \frac{\Sigma(Y_1 + Y_2 + \ldots + Y_n)}{n}$$

where Y is the height of a surface feature and n is the number of features measured in the trace.

DESCRIPTION OF THE PREFERRED EMBODIMENTS

According to the invention, photographic elements are juxtaposed and a vacuum drawn from between them. Devices such as vacuum frames and techniques for such contacting are well-known in the art, as described in, for example, "Basic Contacting Techniques", Kodak Publication No. Q-4A, 1979, "More . . . on Contacting", Kodak Publication No. Q-4B, 1979, or E. Jaffe, *Contact Printing*, Graphic Arts Technical Foundation Inc., 1964.

Vacuum contacting is usually accomplished by placing one or more layered film originals in a vacuum frame along with an unexposed film onto which the exposure is to be made. Vacuum frames are generally one of two types of configurations with the light source either above or below the film plane. There are many known ways of enclosing the films for drawing the vacuum.

The polymeric binder useful in the practice of the invention can be essentially any known polymeric binder. This includes hydrophilic colloids such as gelatin as well as hydrophobic polymer resin binders. While the actual amount of binder coated in order to achieve a desired surface roughness will vary depending on the size and amount of the matte particles, the binder is preferably coated at less than about 1.08 g/m$^2$ to provide sufficient roughness and greater than about 0.20 g/m$^2$ to provide effective adhesion of the matte particles to the surface of the element. Such polymer resin binders are known in the art for adhering matte particles to provide drafting films with rough surfaces for pencil and ink drawings as described, for example, in U.S. Pat. Nos. 3,227,576 and 3,589,905. Useful resin binders include polyurethanes (e.g., Neorez® sold by ICI (Americas, Sancure® sold by Sancor Co.), cellulose acetates (e.g., cellulose diacetate, cellulose acetate butyrate, cellulose acetate propionate), poly(methyl methacrylate), polyesters (e.g., Vitel® sold by Goodyear Tire & Rubber Co.), polyacrylates (e.g., polyethyl acrylate, polymethyl acrylate), polyamides (e.g., Unirez® sold by Union Camp, Vesamide® sold by General Electric Co.), polycarbonates (e.g., Makrolon® sold by Mobay Chemical Co., Lexan® sold by General Electric Co.), polyvinyl acetate, and polyvinyl alcohol. The binder should be chosen so that it will effectively adhere the matte particles to the surface of the element at these binder levels. For cross-linkable binders such as gelatin or polyurethane, the binder is preferably cross-linked so as to provide a high degree of adhesion.

The matte particles used in the practice of the invention can be essentially any solid particle useful as a matting agent, as is well-known in the art. Such particles include, for example, inorganic particles such as silicon dioxide, barium sulfate, desensitized silver halide, zinc particles, manganese colloid, titanium dioxide, magnesium oxide, calcium carbonate, and the like. Organic polymer particles can also be used, and are in many cases are preferred. Examples of monomers that can be polymerized to form polymers useful as polymer matte particles include styrene and styrene derivatives (e.g., styrene, vinyl toluene, vinyl benzene, divinyl benzene) and many other ethylenically unsaturated monomers, such as ethylene, propylene, butylene, ethylene, halogenized vinyl monomers (e.g., vinyl chloride, vinylidene chloride), vinyl esters (e.g., vinyl butyrate, vinyl acetate), monocarboxylic acid esters (e.g., methyl acrylate, butyl acrylate, methyl methacrylate, diethylaminoethyl methacrylate), acrylic or methacrylic acid derivatives (e.g., acrylonitrile, acrylamide), vinyl ethers (e.g., vinyl methyl ether), and N-vinyl compounds (e.g., N-vinyl pyrrole). Copolymers of combinations of the above monomers as well as other known monomers not specifically exemplified are also useful as polymers for matte particles. Particles useful as matting agents are described in further detail in *Research Disclosure*, Item 17643, December, 1978 [hereinafter *Research Disclosure I*], Section XVI and the references cited therein.

Matte particles useful in the present invention can be of essentially any shape. Useful particles will generally have a mean diameter of from about 1 to 15 microns. Especially preferred are particles having a mean diameter of from about 3 to 8 microns. Mean diameter of a particle is defined as the diameter of a spherical particle of identical mass. In some embodiments, it is preferable to have matte particles that are in the form of spherical beads having diameters in the size ranges described above. The amount of matte particles needed to achieve a desired surface roughness will vary on factors such as the distribution of mean diameters of the particles and the amount of polymer binder, a useful range of matte particles is about 2.5 to 16 mg/m$^2$.

Polymer matte particles useful in the practice of the invention can be prepared by techniques well-known in the art, such as by polymerization followed by grinding or milling to obtain the desired particle size, or more preferably by emulsion or suspension polymerization procedures whereby the desired particle size can be produced directly as stable dispersions. Emulsion polymerization techniques can be employed to produce particle sizes ranging from about 0.01 to 5 $\mu$m (preferably about 0.1 to 2.5 $\mu$m) as stable dispersions. Larger size particles, i.e., over about 3 $\mu$m ar preferably prepared by suspension polymerization, often in an organic solvent system from which the particles can be isolated. The bulk, emulsion, and suspension polymerization procedures are well-known to those skilled in the polymer art and are taught in such text books as W.P. Sorenson and T.W. Campbell, *Preparation Methods Of Polymer Chemistry*, 2nd ed., Wiley (1968) and M.P. Stevens, *Polymer Chemistry—An Introduction*, Addison Wesley Publishing Co. (1975).

The matte layer useful in the practice of the invention containing can be applied in any of a number of well-known techniques, such as curtain coating, roller coating, bead coating, doctor blade coating, gravure coating, reverse gravure coating, and the like. The matte particles and the polymer resin binder are preferably mixed together in a liquid medium to form a coating composition. The liquid medium may be a medium such as water or other aqueous solution in which latex particles of the resin binder are dispersed (preferably with the aid of a surfactant) or it may be a solvent such as an organic solvent in which the resin binder (but not the matte particles) is dissolved. After coating, the matte layer is generally dried by simple evaporation, which may be accelerated by known techniques such as convection heating. Known coating and drying methods are described in further detail in *Research Disclosure I*, Sections XI and XV.

The support of the matte-containing photographic element useful in the practice of the invention can be any of a number of well-known supports, such as described in *Research Disclosure I*, Section XVII. These include cellulose esters (e.g., cellulose triacetate, polystyrenes, polyesters (e.g., polyethylene terephthalate), and the like.

Photographic elements according to the invention generally comprise at least one light-sensitive layer, such as a silver halide emulsion layer, although non-silver halide light sensitive layers known in the art may also be used. The light-sensitive layer may be sensitized to a particular spectrum of radiation with, for example, a sensitizing dye as is known in the art. Additional light-sensitive layers may be sensitized to other portions of the spectrum. The light-sensitive layers may contain or have associated therewith dye-forming compounds or couplers. For high-contrast emulsions, which are highly useful in contact printing or duplicating, often of halftone images, it is often preferable to incorporate a hydrazine derivative as described in Simson et al U.S. Pat. No. 4,650,746. Such high-contrast emulsions may be either negative or positive working. Other layers and addenda, such as filter dyes, protective layers, barrier layers, development inhibitor releasing compounds, and the like can be present in photographic elements of the invention, as is well-known in the art. Detailed description of photographic elements and their various layers and addenda can be found in *Research Disclosure I* and in James, *The Theory of the Photographic Process*, 4th ed., 1977.

The contacting process of the invention is used in so-called contact printing or duplicating in which a previously exposed and developed element having an image thereon (i.e., an original) is contacted with another element and exposure is made through the original to form a duplicate or reversal image in the second element. The matte layer useful in the practice of the invention can be the outermost layer of either or both of these elements, although it is preferably the outermost layer of the second element. For use in contact printing or duplicating, the support should be transparent if the matte-containing element is the element to be exposed and the matte is on the opposite side of the support as the light-sensitive layer(s) or if the matte-containing element is the original from which a copy or reversal is to be made. Also, supports having a high dimensional stability, such as polyester film support, are highly preferred.

In one embodiment of the invention, the matte layer is the outermost layer of a photographic element that is an original from which a duplicate or reversal is to be made. The matte layer is preferably on the opposite side of the support as the light-sensitive layer(s). Also, the matte side of the support preferably has no gelatin layers thereon. One element that is useful in the invention is a polyester support having, on one side, a vanadium pentoxide antistatic layer thereon, as described in Guestaux U.S. Pat. No. 4,203,769, and a matte layer as described above over the antistatic layer. On the other side of the support, the element has one or more high-contrast (i.e., γ greater than about 10) silver halide emulsion layer(s). The element is exposed and processed to form a half-tone image. The matte side of the element is then juxtaposed with a second similar high-contrast photographic element and a vacuum is drawn from between the elements. In an alternative embodiment, the outermost matte layer may be on the second element, or on both elements. Exposure of the second element is then made through the first element and the second element is processed to form a duplicate or reversal image of that of the first element.

The invention is further illustrated by the following examples.

EXAMPLE 1

A photographic element for use in the process of the invention was prepared having the following format:

| | |
|---|---|
| AgCl | 4.4 g/m² |
| hardened gelatin | 3.2 g/m² |
| poly(ethylene terephthalate) support | |
| vanadium pentoxide antistatic agent | 1.1 mg/m² |
| poly(acrylonitrile-co-vinylidene chloride-co-acrylic acid) (15:79:6) binder | 8.4 mg/m² |
| polyurethane binder cross-linked with 3 weight % Cymel 300 ® (sold by American Cyanimide) cross-linking agent (level specified in Table I) | 5.4 mg/m² |
| matte particles (number average size 1.45 μm, std. deviation of 1.27–1.62 μm | |

For comparison, an element for use in a process outside the scope of the invention was prepared having the following format:

| | |
|---|---|
| AgCl | 4.4 g/m² |
| hardened gelatin | 3.2 g/m² |
| poly(ethylene terephthalate) support | |
| gelatin binder cross-linked with 4.5 weight % based on dry gelatin weight of bis(vinyl sulfonyl methyl ether) cross-linking agent (level specified in Table I) | 8.6 mg/m² |
| matte particles (number average size 3.25 μm, std. deviation of 1.25 μm | |

To evaluate the effectiveness of each of the elements in a contacting process according to the invention, a 7.6 cm diameter circular disk of each element was placed against a 7.6 cm diameter stainless steel plate with two 32 mm ports in it, one at the center and one at the edge. The center port was connected to a manometer and the edge port to a vacuum pump. A piece of thin latex rubber was placed over the film and plate to form a seal and a vacuum was drawn by the pump. The time required to draw 7.6 cm of fluid in the manometer was recorded and is set forth in Table I as the vacuum smoothness time (VST) along with the $R_a$ measured for the matte side of each element.

TABLE I

| Example | Binder level (g/m²) | $R_a$ (μin) | VST (sec) |
|---|---|---|---|
| 1 | 0.27 | 2.04 | 42 |
| 2 | 0.54 | 1.27 | 60 |
| 3 | 0.81 | 1.67 | 118 |
| Comparison | 3.23 | 0.45 | 192 |

The data presented in Table I show that elements having low binder levels useful in the practice of the invention provide significantly improved vacuum draw-down times than the comparison.

The invention has been described in detail with reference to preferred embodiments thereof. It should be understood, however, that variations and modifications within the spirit and scope of the invention can be made.

What is claimed is:

1. In a process of contacting two photographic elements by juxtaposing the elements and drawing vacuum between them wherein at least one of the elements has been exposed and processed and comprises a support having thereon, as the outermost layer facing the other element, a matte layer comprising matte particles and a polymeric binder, the improvement wherein the matte layer comprises less than about 1.08 g/m² and the matte particles are present in an amount sufficient and have a mean diameter great enough so that said outermost layer has a roughness measurement, $R_a$ as defined by ANSI Standard B46.1 1985, of greater than about 1.00 microinches.

2. A process according to claim 1 wherein said matte particles have a mean diameter of at least about 3 μm.

3. A process according to claims 1 or 2 wherein the matte layer comprises at least about 0.20 gm/m² of said matte particles.

4. A process according to claims 1 or 2 wherein said polymer binder is selected from the group consisting of polyurethanes, cellulose acetates, and poly(methyl methacrylate).

5. A process according to claim 3 wherein said polymer binder is selected from the group consisting of polyurethanes, cellulose acetates, and poly(methyl methacrylate).

6. A process according to claim 1 wherein said matte layer is on the opposite side of the support as a developed silver halide emulsion layer.

7. A process according to claim 6 wherein the matte layer side of the support has no gelatin layers.

8. A process according to any of claims 1, 2, 6, or 7 wherein the support of the element comprising the matte particles is a polyester.

* * * * *